(12) United States Patent
Takahashi et al.

(10) Patent No.: US 6,284,111 B1
(45) Date of Patent: Sep. 4, 2001

(54) SPUTTERING TARGET FREE OF SURFACE-DEFORMED LAYERS

(75) Inventors: Hideyuki Takahashi; Tateo Ohhashi; Kazuhiro Seki, all of Ibaraki-Ken (JP)

(73) Assignee: Nikko Materials Company, Limited, Tokyo (JP)

( * ) Notice: Subject to any disclaimer, the term of this patent is extended or adjusted under 35 U.S.C. 154(b) by 0 days.

(21) Appl. No.: 09/459,805

(22) Filed: Dec. 13, 1999

(30) Foreign Application Priority Data

Jan. 8, 1999 (JP) .................................................. 11-002677

(51) Int. Cl.$^7$ .................................................. C23C 14/34
(52) U.S. Cl. .................. 204/298.12; 204/298.13
(58) Field of Search ............................ 204/298.12, 298.13

(56) References Cited

U.S. PATENT DOCUMENTS

| | | | |
|---|---|---|---|
| 4,663,120 | 5/1987 | Parent et al. | 419/10 |
| 4,750,932 | 6/1988 | Parent et al. | 75/228 |
| 5,294,321 | 3/1994 | Satou et al. | 204/298.13 |
| 5,409,517 | 4/1995 | Satou et al. | 75/228 |
| 5,418,071 | 5/1995 | Satou et al. | 428/552 |
| 5,460,793 | 10/1995 | Kano et al. | 433/344 |
| 5,464,520 | 11/1995 | Kano et al. | 204/298.13 |
| 5,630,918 | 5/1997 | Takahara et al. | 204/298.13 |
| 6,139,701 * | 10/2000 | Pavate et al. | 204/298.12 |
| 6,153,315 * | 11/2000 | Yamakoshi et al. | 204/298.13 |

FOREIGN PATENT DOCUMENTS

| | | |
|---|---|---|
| 634498 | 1/1995 | (EP) . |
| 902102 | 3/1999 | (EP) . |
| 03-257158 | 11/1991 | (JP) . |
| 07-118842 | 5/1995 | (JP) . |
| 10 158 829 A * | 6/1998 | (JP) . |
| 10 310 470 A * | 11/1998 | (JP) .................................. 204/298.12 |
| 11 080 942 A * | 3/1999 | (JP) .................................. 204/298.12 |

OTHER PUBLICATIONS

English Abstract of the Japanese publication No. 03–257158 (Derwent).
English Abstract of the Japanese publication No. 03–257158 (Dialog).
English Abstract of the Japanese publication No. 07–118842 (Derwent).
Ishigami et al., "High Purity Ti Sputter Target for VLSIs", Toshiba Review, No. 161, pp. 38–41, Autumn 1987.
A. Abel et al., "Preparation and Characterization of Pure Metals", Metals Handbook, 10$^{th}$ Edition, vol. 2, pp. 1095–1097, 1990.
Co–pending U.S. Patent application No. 09/060,209, filed Apr. 14, 1998.

* cited by examiner

Primary Examiner—Nam Nguyen
Assistant Examiner—Gregg Cantelmo
(74) Attorney, Agent, or Firm—Howson and Howson

(57) ABSTRACT

A sputtering target is provided which provides early stabilization of the film-deposition rate of the sputtering target from its initial stage of use. The sputtering target surface subjected to erosion is formed with a surface-deformed layer. The surface-deformed layer is reduced by precision machining and removed by etching. The extent of etching is controlled so that the surface roughness (Ra) is in a range between 0.1% and 10% of the mean crystal grain diameter of the material constituting the target. The surface roughness (Ra) is defined as the mean roughness on the center line of the surface.

1 Claim, 1 Drawing Sheet

SPUTTERING TARGET FREE OF SURFACE-DEFORMED LAYERS

FIELD OF THE INVENTION

The present invention relates to a sputtering target which provides a stable film deposition rate from an initial stage of sputtering and which eliminates the need for burn-in, or pre-sputtering, which removes substantially the entire surface-deformed layer of the sputtering target to provide the surface of the sputtering target in a state suitable for sputtering. The present invention also relates to a method for manufacturing such a sputtering target.

BACKGROUND OF THE INVENTION

Heretofore, the surface of a sputtering target has been finished by machining, such as, cutting, grinding, or polishing.

Due to the characteristics of machining by forcedly processing while physically breaking metal crystal grains, a large number of strains and defects, known as a surface-deformed layer, remain on the surface of the target.

Since sputtering is a process for releasing metal atoms constituting the target by using collision energy generated by physically colliding cations, such as Ar+, to a target installed on a cathode, the ease of releasing the metal atoms themselves differs depending upon the arrangement of metal atoms in a crystal (crystal orientation).

In a sputtering target having machining-affected layers as described above still remaining on the surface of the sputtering target, a stable surface state which provides a stable film deposition rate is obtained only after the target has been used for a certain period of time.

Therefore, as long as surface-deformed layers remain on the sputtering target, the deposition rate cannot be stabilized. This in turn causes an increase in the use of integrated input electric energy which is required for pre-sputtering of the target.

In order to solve such problems, a method for removing surface-deformed layers by etching the target surface has been proposed (Japanese Patent Laid-Open No. 7-118842).

However, such a method has a problem in that the integrated input energy required for pre-sputtering cannot be significantly decreased by rigorous etching under conditions suitable for removing surface-deformed layers.

OBJECTS OF THE INVENTION

In order to solve the above-described problems, in particular to realize quick stabilization of the film deposition rate, the object of the present invention is to provide a sputtering target which has a surface in a desired state so that a stable film deposition rate is provided from the initial stage of use of the sputtering target.

Another object of the present invention is to provide a method for manufacturing such a sputtering target.

SUMMARY OF THE INVENTION

The inventors of the present invention conducted repeated examinations for solving the above-described problems and obtained the following findings.

In the state where the film deposition rate of a sputtering target is stabilized after the sputtering target has been used for a certain period of time, a microscopic crystal surface covers the target surface which is subjected to erosion and from which metal atoms are easily released by sputtering. Such a crystal surface appears one after another even after sputtering has been proceeded.

Unless the surface of the target has been covered with a crystal surface which can be readily sputtered at a stable film deposition rate, integrated input electric power cannot be decreased to zero. This is true even if the surface roughness of the target is minimized, for example, by mirror polishing, or even if the target surface is in a state where no surface-deformed layers are present. (See Comparative Example 3 which is discussed later in this application.)

If a surface-deformed layer remains on an area of the target undergoing sputtering, the film deposition rate is higher than a stabilized film deposition rate. Therefore, the surface-deformed layer must be removed to substantially zero to stabilize the film deposition rate.

Even if there is no surface-deformed layer, a target having a crystal surface that is easily sputtered cannot be obtained if the target surface is excessively rough. Such a target requires pre-sputtering to obtain a surface which is easily sputtered. (See Comparative Example 5 discussed later in this application.)

A target which consumes little integrated input electric power until the film deposition rate is stabilized can be obtained by decreasing the surface-deformed layer to substantially zero. This can be accomplished by precision machining the target in order to minimize the surface-deformed layer and then by etching the target until the surface of the target is covered with a crystal surface that is easily sputtered.

On the basis of the above described findings and according to a first aspect of the present invention, a sputtering target is provided such that it is practically free of surface-deformed layers created by machining the target surface subjected to erosion. This surface is provided with a surface roughness (Ra) in a range between about 0.1% and 10% of the mean crystal grain diameter of the material constituting the target. The surface roughness (Ra) is defined as the mean roughness on the center line of the surface which is subjected to erosion.

According to a second aspect of the present invention, the surface roughness (Ra) of the above referenced target surface is in a range between about 1% and 10% of the mean crystal grain diameter.

According to a third aspect of the present invention, a method for manufacturing a sputtering target is provided. The method comprises the steps of reducing the surface-deformed layer by precision machining the target surface and etching the target surface to make the surface roughness (Ra) of the target surface be in a range of between about 0.1% and 10% of the mean crystal grain diameter of the material constituting the target.

According to a fourth aspect of the present invention, the above described method is utilized to provide the target surface with a surface roughness (Ra) in a range of about 1% and 10% of the mean crystal grain diameter.

According to a fifth aspect of the present invention, the precision machining step of the above described method is utilized until the thickness of the surface-deformed layer is reduced to about 20 µm or less.

DETAILED DESCRIPTION OF THE PREFERRED EMBODIMENTS AND METHODS

Figure 1:
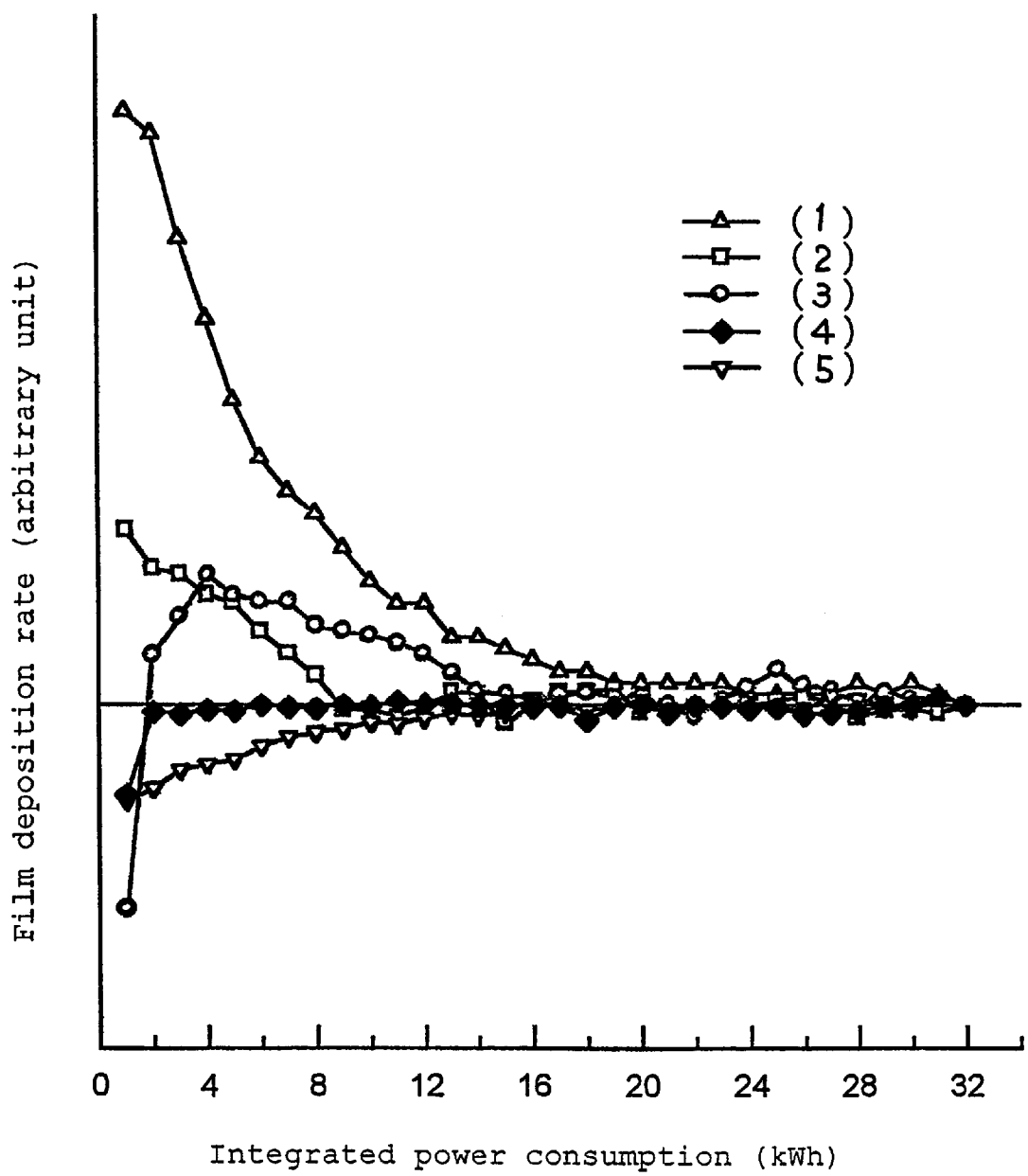
FIG. 1 is a graph showing the relationship between integrated electric power consumption and film deposition rate of the Embodiment and Comparative Embodiments of the present invention.

The present invention is described in detail hereinafter referring to an Embodiment and Comparative Embodiments.

Ti targets having a purity of 99.995% by weight and a mean crystal grain diameter of 40 $\mu$m were used for five sample targets discussed below. The five samples were prepared and subjected, respectively, to the following surface finishing: (1) ordinary lathe finishing; (2) ordinary lathe finishing and wet polishing; (3) precision lathe finishing; (4) precision lathe finishing and wet polishing and chemical etching; and (5) precision lathe finishing and a large amount of chemical etching.

The properties of the samples are shown in Table 1. As Table 1 shows, sample (4) is the Embodiment of the present invention, and samples (1), (2), (3) and (5) are Comparative Examples.

Surface roughness was measured by a contact roughness meter, and the thickness of the surface-deformed layer was estimated by an X-ray diffractometer.

Chemical etching was carried out by immersing the samples for 60 seconds in a mixed solution of 5% by volume hydrofluoric acid, 15% by volume nitric acid, and 80% by volume water.

TABLE 1

| | Symbol | Mean Roughness on the center line Ra ($\mu$m) | Thickness of machining-affected layer ($\mu$m) | Relative ratio (%) roughness/grain diameter |
|---|---|---|---|---|
| Comparative Example | (1) | 4 | 30 | 10 |
| Comparative Example | (2) | 0.4 | 15 | 1 |
| Comparative Example | (3) | 0.1 | 20 | 0.25 |
| Example | (4) | 0.7 | 0 | 1.75 |
| Comparative Example | (5) | 20 | 0 | 50 |

The film deposition rates plotted for integrated electric energy are shown in FIG. 1. For samples (1) and (2), the surface-deformed layers are thick, and the film forming speed is high in the initial stage of use of the sputtering target.

That is, since a large number of surface-deformed layers remain in sample (1), the film deposition rate is high in the initial stage, and the film deposition rate reaches almost a stable (ie. normal) state when integrated electric energy reaches about 20 kWh.

For sample (2), less integrated electric power is required as compared to sample (1) for the film deposition rate to reach an almost stable state. The film deposition rate becomes almost stable at about 10 kWh of integrated electric power.

The surface-deformed layer of sample (3) is thinner (20 $\mu$m) than that of sample (1) and thus approaches a favorable surface state. However, the surface roughness of sample (3) is relatively small (mirror finishing). Thus, sputtering is difficult in the initial stage of use of sample (3), and the film deposition rate is lower than that of a stable film deposition rate. For sample (3), the mean roughness Ra on the center line of the target is 0.25% of the mean crystal grain diameter.

Thereafter, since surface deformed layers of about 20 $\mu$m remain in sample (3), the film deposition rate increases before it stabilizes at which time the integrated electric power reaches about 16 kWh. Such variations in the film deposition rate are not preferable.

With respect to sample (4), which is the Embodiment of the present invention, almost all of the surface-deformed layer has been removed by etching, and the film deposition rate is low until integrated electric power reaches about 1 kWh when the naturally oxidized layer on the uppermost surface is removed. Thereafter, the film deposition rate is highly stabilized. In sample (4), the surface roughness Ra is 1.75% of the mean crystal grain diameter.

It is shown that the stable film deposition rate is obtained from the very initial stage of use of the sputtering target according to the present invention.

Although the Comparative Example (5) has no surface-deformed layers, the amount of etching is large and surface roughness is large. Therefore, the film deposition rate is low in the initial stage of use, and thereafter, it is almost stabilized as integrated electric power reaches about 14 kWh.

As described above with respect to the samples, after the surface-deformed layer of the surface of the sputtering target has been decreased and then adequately etched thereby obtaining a state close to the state where the surface is covered with an orderly crystal surface suitable for sputtering, the film deposition rate is stabilized from an initial stage of use.

Turning to Table 2, it shows the relationship between the surface roughness Ra, the ratio of the surface roughness Ra to the particle diameter, and the integrated electric power required for the film deposition rate to stabilize. In Table 2, A, B, F and G are Comparative Examples and C, D and E are the Embodiments of the present invention.

TABLE 2

| | Mean Roughness on the center line Ra ($\mu$m) | Relative ratio (%) roughness/grain diameter | Integrated power consumption (kWh) | Thickness of machining-affected layer ($\mu$m) |
|---|---|---|---|---|
| A | 0.004 | 0.01% | 20 | 10 |
| B | 0.02 | 0.05% | 16 | 10 |
| C | 0.04 | 0.1% | 8 | 0 |
| D | 0.4 | 1.0% | 2 | 0 |
| E | 4 | 10% | 3 | 0 |
| F | 20 | 50% | 14 | 0 |
| G | 32 | 80% | 18 | 0 |

Comparative Examples A and B correspond to previously described Comparative Example (3). However, the surface roughnesses of Comparative Examples A and B have been further reduced, that is, mirror polished. The film deposition rate of Comparative Example B stabilizes when integrated electric power reaches 16 kWh which is almost the same as Comparative Example (3). The film deposition rate of Comparative Example A stabilizes when integrated electric power reaches 20 kWh, which is an increase in comparison to Comparative Example (3).

Examples C, D and E and Comparative Examples F and G correspond to previously discussed Example (4), except that their surface roughnesses are different than Example (4) because their etching times were altered. Comparative Example F corresponds to previously discussed Comparative Example (5).

The film deposition rates of Examples C, D and E and Comparative Examples F and G stabilize when the integrated electric power reaches 8, 2, 3, 14 and 18 kWh, respectively. Thus, it is demonstrated that the preferable ratio of the surface roughness Ra to the grain diameter is within a range of between 0.1% and 10%, and more preferably, between a range of 1.0% and 10%.

It is shown from this that excessive etching of target materials does not provide favorable and quickly stabilized film deposition rates.

As described above, the present invention provides, in an initial stage of manufacturing the target, a surface which approximates the surface of a sputtering target during a normal state of sputtering. This is a sputtering target surface with an exposed uneven texture of crystal grains.

In the target thus manufactured, sputtering proceeds as ordinary sputtering, and the surface is the same as, or similar to, the sputtered surface in a normal state.

According to the present invention, as described above, a sputtering target useful in providing a stabilized film deposition rate from an initial stage of sputtering can be provided by making a sputtering target surface in a state close to a state where the surface has an exposed uneven texture of grains, rather than removing almost all of the surface-deformed layers and mirror polishing the surface.

We claim:

1. A sputtering target comprising a surface subjected to erosion, said surface being substantially free of a surface-deformed layer, made of a metal having a pre-determined mean crystal grain diameter, and having a surface roughness (Ra) defined as a mean roughness on a center line of said surface in a range of between about 1.0% and 10% of said mean crystal grain diameter of said metal, wherein said surface roughness (Ra) is in a range between 0.4 $\mu$m and 4 $\mu$m.

* * * * *